United States Patent
Brody

(10) Patent No.: US 7,531,470 B2
(45) Date of Patent: May 12, 2009

(54) METHOD AND APPARATUS FOR ELECTRONIC DEVICE MANUFACTURE USING SHADOW MASKS

(75) Inventor: Thomas P. Brody, Pittsburgh, PA (US)

(73) Assignee: Advantech Global, Ltd, Road Town, Tortola (VG)

( * ) Notice: Subject to any disclaimer, the term of this patent is extended or adjusted under 35 U.S.C. 154(b) by 672 days.

(21) Appl. No.: 11/236,937

(22) Filed: Sep. 27, 2005

(65) Prior Publication Data

US 2007/0068559 A1    Mar. 29, 2007

(51) Int. Cl.
*H01L 21/00* (2006.01)

(52) U.S. Cl. .................. 438/800; 438/689; 216/12; 134/2; 257/E21.532

(58) Field of Classification Search .......... 438/689, 438/800; 216/12; 134/2
See application file for complete search history.

(56) References Cited

U.S. PATENT DOCUMENTS

| | | | |
|---|---|---|---|
| 3,657,613 A | 4/1972 | Brody et al. | |
| 3,794,873 A | 2/1974 | Kaplan et al. | |
| 4,450,786 A | 5/1984 | Doehler et al. | |
| 6,193,897 B1 * | 2/2001 | Nikaido et al. | 216/12 |
| 6,281,552 B1 | 8/2001 | Kawasaki et al. | |
| 6,821,348 B2 | 11/2004 | Baude et al. | |
| 2002/0009538 A1 | 1/2002 | Arai | |
| 2003/0228715 A1 * | 12/2003 | Brody et al. | 438/30 |
| 2005/0031783 A1 * | 2/2005 | Brody et al. | 427/248.1 |

* cited by examiner

*Primary Examiner*—Zandra Smith
*Assistant Examiner*—Christy L Novacek
(74) *Attorney, Agent, or Firm*—The Webb Law Firm

(57) ABSTRACT

Electronic devices are formed on a substrate that is advanced stepwise through a plurality of deposition vessels. Each deposition vessel includes a source of deposition material and has at least two shadow masks associated therewith. Each of the two masks is alternately positioned within the corresponding deposition vessel for patterning the deposition material onto the substrate through apertures in the mask positioned therein, and positioned in an adjacent cleaning vessel for mask cleaning. The patterning onto the substrate and the cleaning of at least one of the masks are performed concurrently.

16 Claims, 8 Drawing Sheets

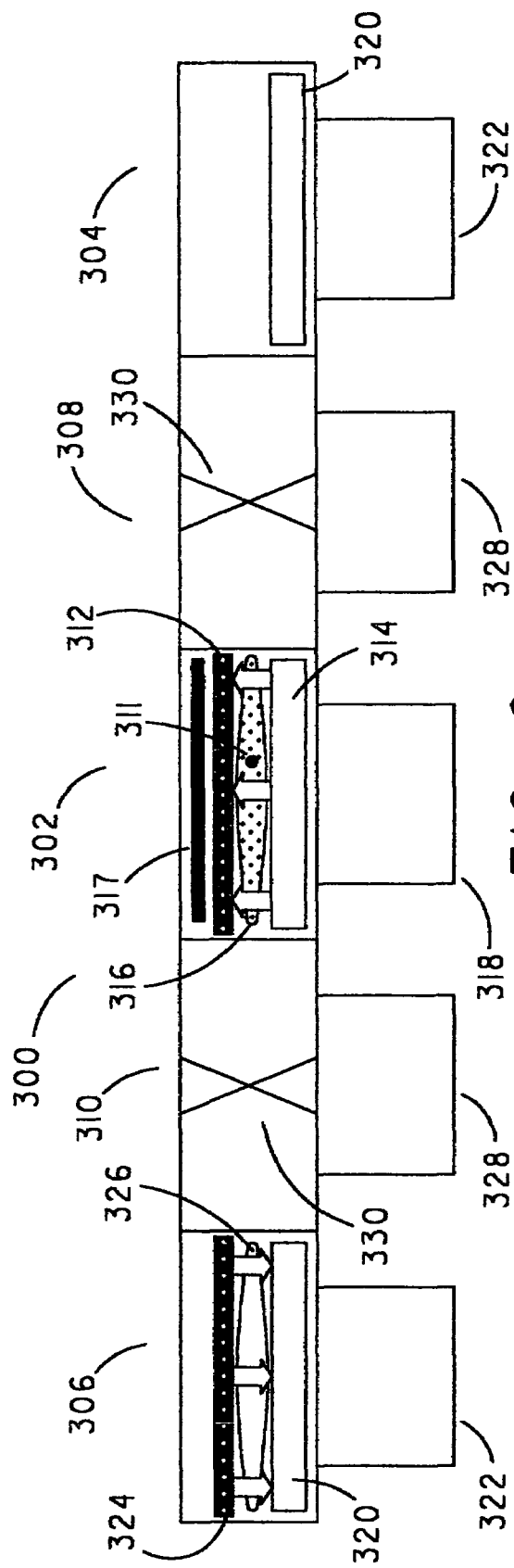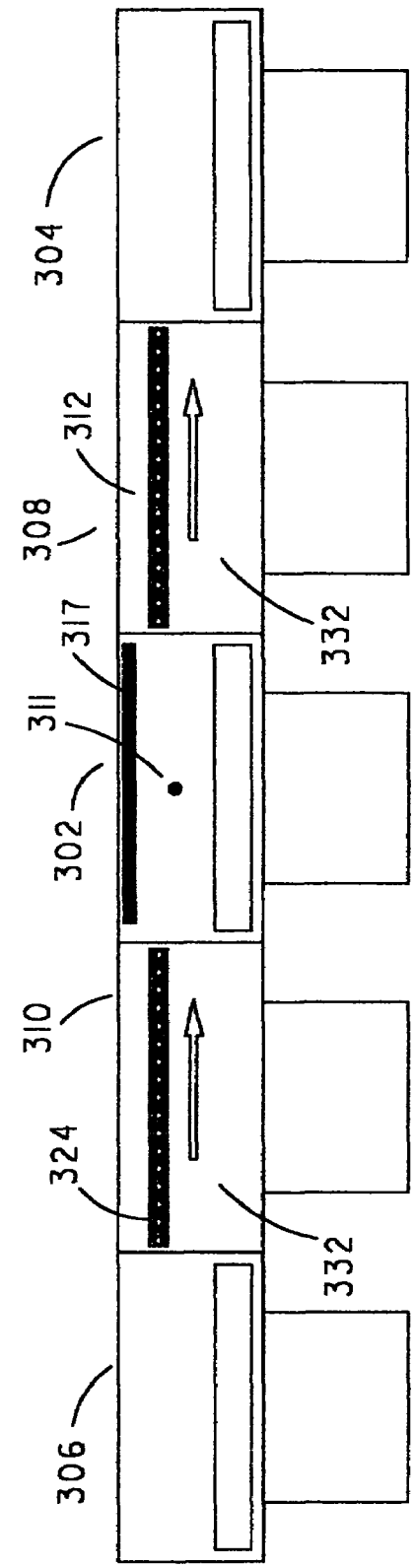

METHOD AND APPARATUS FOR ELECTRONIC DEVICE MANUFACTURE USING SHADOW MASKS

BACKGROUND OF THE INVENTION

1. Field of the Invention

This invention relates to methods and systems for fabricating electronic circuits, and particularly to apparatus and methods incorporating shadow masks and shadow mask cleaning in the manufacture of integrated circuits.

2. Description of Related Art

Large area active electronic devices are widely used in flat panel displays and related technologies. For example, active matrix backplanes are used in flat panel displays for routing signals to pixels of the display in order to produce viewable pictures. Active matrix backplanes, as well as other large area electronic circuits, are multilayer devices presently manufactured using photolithography, a pattern definition technique that uses electromagnetic radiation, such as ultraviolet radiation, to expose a layer of a photoresist material deposited on the surface of a substrate. Exemplary photolithographic processing steps to produce a layer of a multilayer active matrix backplane on a substrate include: coat with photoresist, pre-bake, soak, bake, align, expose, develop, rinse, bake, deposit a layer, lift off the photoresist, scrub, rinse, and dry.

Photolithography-based manufacturing methods thus include a wide variety of both additive (material deposition) steps and subtractive (material removal) steps, requiring large, complex and expensive fabrication facilities that incorporate many disparate manufacturing technologies. Furthermore, many photolithographic manufacturing steps must be carried out in clean room environments, further driving the manufacturing complexity and costs high.

Alternatively, a vapor deposition shadow mask process is well-known and has been used for years in microelectronics manufacturing. The vapor deposition shadow mask process is a significantly less costly and less complex manufacturing process, compared with photolithography-based manufacturing. The vapor deposition shadow mask process can be used to form one or more electronic devices on a substrate using additive processes only. This is done by sequentially depositing patterns of materials including conductors, semiconductors and insulators, through complementary patterns of apertures in shadow masks positioned between one or more material deposition sources and the substrate.

One challenge in implementing all-additive process steps for the volume manufacturing of electronic circuits is that as a shadow mask is used repetitively for patterning a material onto a substrate, the mask also accumulates the material on its surface and in its pattern of apertures, changing the dimensions of the apertures and thereby degrading mask performance for future depositions through that mask onto a substrate. Frequent replacement of a shadow mask, especially a large area mask, generally is neither practical nor cost-effective for a volume manufacturing process. Some degraded shadow masks may be cleaned to remove deposited material from the mask, but shadow mask cleaning is generally considered incompatible with high volume production of electronic devices because most mask cleaning methods are very slow or labor intensive or would require that the mask be removed from a production line and brought to a separate environment for cleaning.

Accordingly, a need exists in this art for equipment and methods to rapidly and cost-effectively clean shadow masks in a volume manufacturing setting. In addition, a need exists for apparatus and methods for rapidly replacing a used shadow mask for a fresh shadow mask in a manufacturing line.

SUMMARY OF THE INVENTION

The invention is a method of forming an electronic device. The method includes (a) sequentially advancing a substrate through a plurality of vacuum deposition vessels positioned along a fabrication path, wherein each deposition vessel includes (i) a material deposition source including deposition material, (ii) a first shadow mask positioned within the deposition vessel, the first shadow mask having a predetermined pattern of apertures therethrough, (iii) a first cleaning vessel positioned adjacent the deposition vessel, and (iv) a second cleaning vessel positioned adjacent the deposition vessel, wherein: the first cleaning vessel, the deposition vessel and the second cleaning vessel define a cleaning path that is transverse to the fabrication path; a second shadow mask is positioned in the second cleaning vessel, the second shadow mask having the predetermined pattern of apertures therethrough; the first cleaning vessel is operative for cleaning the first shadow mask when the first shadow mask is received therein; and the second cleaning vessel is operative for cleaning the second shadow mask when the second shadow mask is received therein; (b) cleaning the second shadow mask positioned in the second cleaning vessel concurrently with depositing the deposition material through the predetermined pattern of apertures of the first shadow mask and onto the substrate; (c) moving the first shadow mask along the cleaning path from the deposition vessel to the first cleaning vessel and moving the second shadow mask along the cleaning path from the second cleaning vessel to the deposition vessel; and (d) cleaning the first shadow mask positioned in the first cleaning vessel concurrently with depositing the deposition material through the predetermined pattern of apertures of the second shadow mask and onto the substrate.

The method can further include (e) moving the second shadow mask along the cleaning path from the deposition vessel to the second cleaning vessel and moving the first shadow mask along the cleaning path from the first cleaning vessel to the deposition vessel; and (f) repeating step (b)-(e) at least once.

The method can further include advancing the substrate along the fabrication path between deposits of deposition material onto the substrate.

The method can further include measuring an end point for cleaning each shadow mask to indicate when the shadow mask is clean.

The deposition material can be chemically distinct from a chemical component of each shadow mask.

Each cleaning vessel can include a plurality of cleaning chambers, with each chamber operative for cleaning a shadow mask.

Each cleaning vessel can include a plasma source or a source of gaseous etchant for cleaning the corresponding shadow mask. The etchant can be selected from either a group consisting of a halogen, a halogen-containing chemical compound and oxygen or a group consisting of hydrogen and a hydrogen-containing chemical compound.

The first cleaning vessel and the deposition vessel can be interconnected by a first vacuum valve. The second cleaning vessel and the deposition vessel can be interconnected by a second vacuum valve. Moving the first shadow mask can include passing the first shadow mask through the first valve. Moving the second shadow mask can include passing the second shadow mask through the second valve.

The cleaning path can be substantially linear.

The time required for cleaning at least one shadow mask can be either less than a time required for depositing the material on the substrate or does not substantially exceed a time required for depositing the material on the substrate.

The invention is also a method of forming an electronic device comprising (a) providing a substrate adapted for advancement along a fabrication path, a first portion of the substrate positioned at a first process location along the path; (b) providing a deposition source for depositing a material on the substrate at the first process location; (c) providing a first shadow mask and a second shadow mask substantially identical to the first shadow mask; (d) positioning the first shadow mask between the deposition source and the first portion of the substrate and positioning the second shadow mask adjacent the fabrication path; (e) depositing the material on the first portion of the substrate through the first shadow mask while concurrently cleaning the second shadow mask; (f) advancing the substrate along the fabrication path whereupon a second portion of the substrate is positioned at the first process location; (g) positioning the second shadow mask between the deposition source and the second portion of the substrate and positioning the first shadow mask adjacent to the fabrication path; and (h) depositing the material on the second portion of the substrate through the second shadow mask while concurrently cleaning the first shadow mask.

The material can be deposited and each shadow mask can be cleaned in the presence of a vacuum.

The method can further include providing a first cleaning vessel for cleaning the first shadow mask and a second cleaning vessel for cleaning the second shadow mask, wherein each cleaning vessel includes means for determining completion of a cleaning process.

Cleaning each shadow mask can include (i) exposing the shadow mask to at least one of a plasma and a chemical etchant; (ii) reactive ion etching; or (iii) physical sputtering.

The invention is also an apparatus for manufacturing an electronic device. The apparatus includes (a) a plurality of interconnected deposition vessels defining an elongated fabrication path; (b) means for advancing a substrate along the fabrication path; (c) at least one material deposition source positioned in each deposition vessel for depositing a material on the substrate when the substrate is positioned in the deposition vessel; and (d) two cleaning vessels connected to each deposition vessel, each cleaning vessel operative for receiving a shadow mask from the corresponding deposition vessel for cleaning and for passing the shadow mask to the corresponding deposition vessel for depositing the material onto the substrate through a pattern of apertures in the shadow mask.

Each cleaning vessel can be operative for cleaning the shadow mask by reactive ion etching or by physical sputtering. The substrate can be either continuous or segmented along the fabrication path.

The apparatus can further include means for monitoring shadow mask cleanliness.

Each cleaning vessel can be connected to its corresponding deposition vessel via a vacuum valve.

The invention is also an apparatus for manufacturing an electronic device. The apparatus includes a plurality of vacuum deposition vessels positioned along a fabrication path and configured for receiving a substrate advanced along the path and a material deposition source positioned in each deposition vessel. A plurality of shadow masks is provided and a plurality of shadow mask cleaning vessels are coupled to each deposition vessel and define therewith a cleaning path that intersects the fabrication path. For each deposition vessel, one corresponding cleaning vessel is operative for cleaning one shadow mask while the corresponding deposition source is depositing a material through another shadow mask onto a first portion of the substrate and another cleaning vessel is operative for cleaning the other shadow mask while the deposition source is depositing the material through the one shadow mask onto a second portion of the substrate.

Lastly, the invention is an apparatus for manufacturing an electronic device. The apparatus includes a plurality of series connected vacuum deposition vessels and a material deposition source positioned within each deposition vessel. Means is/are provided for advancing a substrate along a longitudinal fabrication path through the plurality of deposition vessels. A vacuum cleaning vessel is coupled to each deposition vessel and a shadow mask is associated with each deposition vessel. Means is/are provided for passing the shadow mask between the deposition vessel and the corresponding cleaning vessel. The shadow mask is alternately positioned in the cleaning vessel for cleaning the shadow mask, and positioned between the deposition source and the substrate in the deposition vessel for depositing a material from the material deposition source onto the substrate.

BRIEF DESCRIPTION OF THE DRAWINGS

FIG. 1b illustrates an embodiment of one of the plurality of the process stations illustrated in FIG. 1a;

FIG. 6 through FIG. 9 illustrate end views of a process station of the present invention and a sequence of process steps for mask cleaning according to the present invention.

DETAILED DESCRIPTION OF THE INVENTION

Figure 1A:
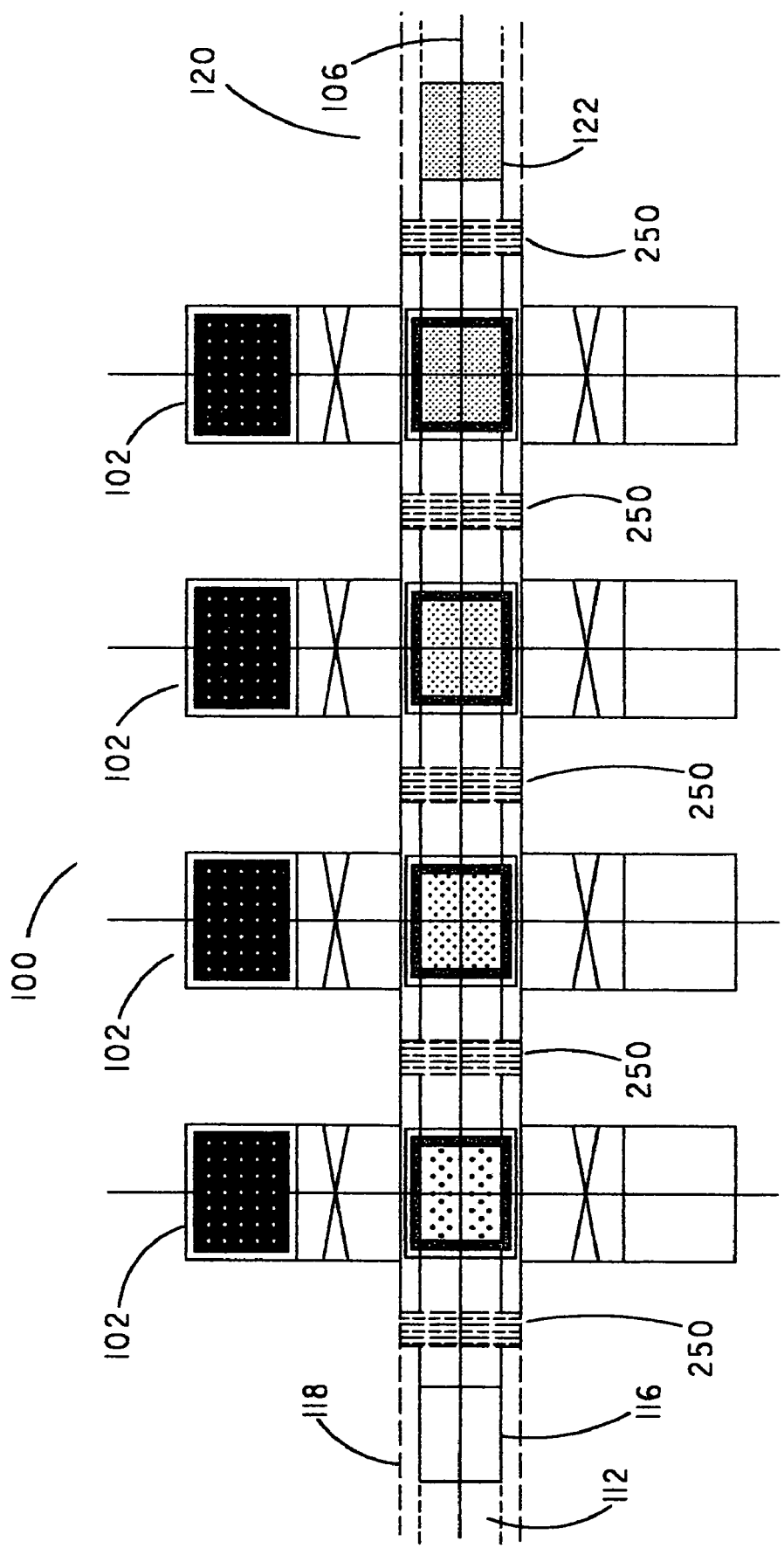
FIG. 1a illustrates schematically in plan view a plurality of process stations in a manufacturing system of the present invention, wherein a first shadow mask is positioned in a deposition vessels associated with each station, and a second shadow mask is positioned in a cleaning vessel.

Certain exemplary embodiments will now be described to provide an overall understanding of the aspects and features of the methods, apparatus, and systems disclosed herein. Examples of these embodiments and features are illustrated in the drawings. Those of ordinary skill in the art will understand that the apparatus, systems and methods of use disclosed herein can be adapted and modified to provide apparatus, systems and methods for other applications and that other additions and modifications can be made without departing from the scope of the present disclosure. For example, the features illustrated or described as part of one embodiment or one drawing can be used on another embodiment or another drawing to yield yet another embodiment. Such modifications and variations are intended to be included within the scope of the present disclosure.

The present invention relates to methods, apparatus and systems for the manufacture of electronic devices on substrates, and in particular to the use of shadow masks in the manufacture of electronic devices, where cleaning of the masks is integrated into the manufacturing process and apparatus therefor. Some aspects of the apparatus and methods for forming electronic devices using shadow masks are disclosed in U.S. Pat. No. 6,943,066, which is incorporated herein by reference. By electronic devices, we mean an assembly of electronic elements that may be any combination of active electronic elements and passive electronic elements formed on a substrate. The active elements may include transistors, diodes, radiation emitters, sensors or any other type of active element. The passive elements may include electrical conductors, resistors, capacitors, inductors or any other type of passive element. By a shadow mask, we mean a sheet of a mask material that is penetrated by a predetermined pattern of apertures, also called vias, through which a complementary pattern of a deposition material supplied by a vapor deposition source (deposition source) can be deposited onto the substrate (also referred to herein as patterning the deposition material onto the substrate) in a layer that contributes to the formation of the electronic device. An electronic device may be formed from any number of layers. Typically, each consecutive patterned layer differs from a layer over which it is patterned with regard to at least one of a deposition material, a mask pattern and a layer thickness.

Figure 1B:
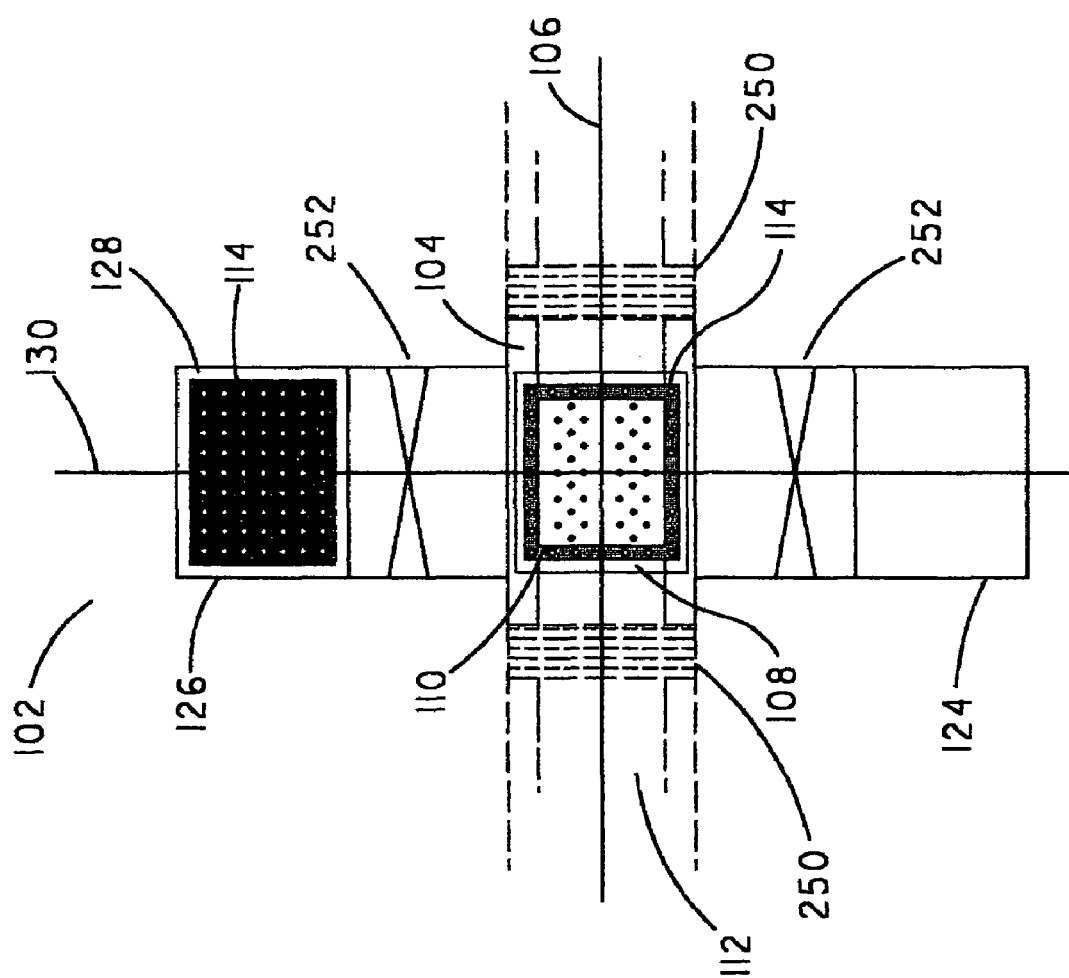

With reference to FIG. 1a, an electronic device manufacturing system 100 of the present invention includes a plurality of process stations 102. FIG. 1b illustrates a representative one of the plurality of process station 102. Each process station 102 includes a vacuum deposition vessel 104 positioned along a longitudinal fabrication path 106. Each deposition vessel 104 also includes a material deposition source 108 and a first shadow mask 110 through which a deposition material from deposition source 108 is patterned onto a substrate 112 through a pattern of apertures 114 in first shadow mask 110. Deposition source 108 can be an evaporative source, a sputtering source or another type of vacuum deposition source. The deposition material can be any material useful for forming one or more electronic devices on substrate 112 and that can be deposited on substrate 112 via deposition source 108 and apertures 114 of first shadow mask 110. Examples of deposition materials include conductors, semiconductors and insulators. The interior of deposition vessel 104 typically is maintained under high vacuum conditions to perform depositions, at pressures typically in the range of $10^{-5}$ torr to $10^{-7}$ torr.

Substrate 112 may be a continuous flexible substrate along fabrication path 106, or may comprise a longitudinal array of flexible or rigid substrate sections along fabrication path 106. Substrate 112 may be any type of substrate upon which the deposition material can be deposited, including polymer, glass, crystal and metal. Fabrication path 106 may be linear, curved or bent in any manner consistent with advancing substrate 112 through the plurality of process stations 102. In one non-limiting embodiment, an unpatterned portion 116 of substrate 112 enters fabrication system 100 at an entrance 118, sequentially receives a patterned layer of a deposition material in the deposition vessel 104 at each station 102, and leaves fabrication system 100 at an exit 120, with one or more electronic device(s) 122 formed thereon. At each step in the sequence, substrate 112 is advanced along fabrication path 106 so that a portion of substrate 112 moves from one process station 102 to the next process station 102 of the plurality of process stations 102. Each deposition of a layer of a deposition material on substrate 112 is an additive step in forming the one or more electronic device(s) 122.

The plurality of stations 102 may include any number of process stations required to form one or more desired electronic device(s) 122 on substrate 112. In one non-limiting embodiment, the plurality of process stations 102 includes six process stations, forming at least one active electronic device 122 on substrate 112 by patterning in sequence along fabrication path 106 a first insulator, a semiconductor, a first conductor, a second conductor, a second insulator and a third conductor. The electronic device can be a thin-film transistor (TFT) backplane for a flat panel display, wherein the electronic elements of the electronic device can be cadmium selenide thin film transistors. The description of the electronic device being a TFT backplane, however, is not to be construed as limiting the invention since it is envisioned that the plurality of stations 102 of manufacturing system 100 can be utilized to produce other types of electronic devices.

Each time a shadow mask 110 is used to pattern a deposition material onto a substrate 112 during a deposition, a layer of the deposition material is also deposited as a film on the surface of the mask (on the mask) 110. With each additional deposition through mask 110 onto substrate 112, the film on mask 110 increases in thickness, eventually degrading the performance of mask 110 as the pattern of apertures 114 becomes obscured, distorted, or otherwise changed by the film. Changes in mask 110 due to accumulated deposition material may include filling of apertures 114 with the deposition material, warping of mask 110, reduced thermal stability of mask 110 due to differential thermal expansion properties between the film and mask 110, and partial or complete delamination of the film from the mask 110. Thus, there is a requirement to periodically replace shadow mask 110 or to clean shadow mask 110 to sustain patterning performance in manufacturing system 100. Frequent replacement of shadow masks 110 is generally economically infeasible in volume manufacturing environments. Therefore, the present invention includes methods, apparatus and systems for cleaning shadow masks 110 for volume manufacturing of electronic devices on substrates.

Shadow masks 110 used for forming layers of deposition materials in the manufacture of electronic devices typically require frequent cleaning. For example, suppose a shadow mask having a 50 micrometer diameter circular aperture therein is used for patterning a substantially 50 micrometer diameter, 0.5 micrometer thick pad of a deposition material on a substrate. If the maximum tolerance of the pad diameter is 10% from its nominal 50 micrometer diameter, and the deposition material deposits isotropically on the mask surface and inside the aperture during a deposition, each deposition of a pad will reduce the effective inner diameter of the aperture by one micrometer, whereupon the aperture will decrease in diameter to its diametric tolerance limit after five depositions. To avoid this problem, although a mask may require cleaning only after a plurality of depositions therethrough, it may be desirable to clean the mask after every deposition. Frequent mask cleaning may increase performance consistency between consecutive depositions through the mask and may optimize the performance lifetime of a mask by providing consistent cycling of the mask through deposition and cleaning cycles, as well as by avoiding stresses from accumulated multiple layers of deposited material. An embodiment wherein a shadow mask used for patterning onto a substrate is exchanged with a clean shadow mask after each deposition through the mask will now be described.

Each process station 102 includes a first mask cleaning vessel 124 and a second mask cleaning vessel 126. Each first cleaning vessel 124 and second cleaning vessel 126 is operative for cleaning a mask by removing a film of deposition material from the mask substantially without damaging the mask. In FIGS. 1a and 1b, first mask 110 is illustrated positioned in deposition vessel 104, and a second shadow mask 128 having the pattern of apertures 114 is positioned in second cleaning vessel 126. Second shadow mask 128 can be substantially identical to first shadow mask 110. First cleaning vessel 126, deposition vessel 104 and second cleaning vessel 128 define a cleaning path 130 along which first mask 110 and second mask 128 can be translated. Cleaning path 130 can be linear or is folded.

Figure 2:
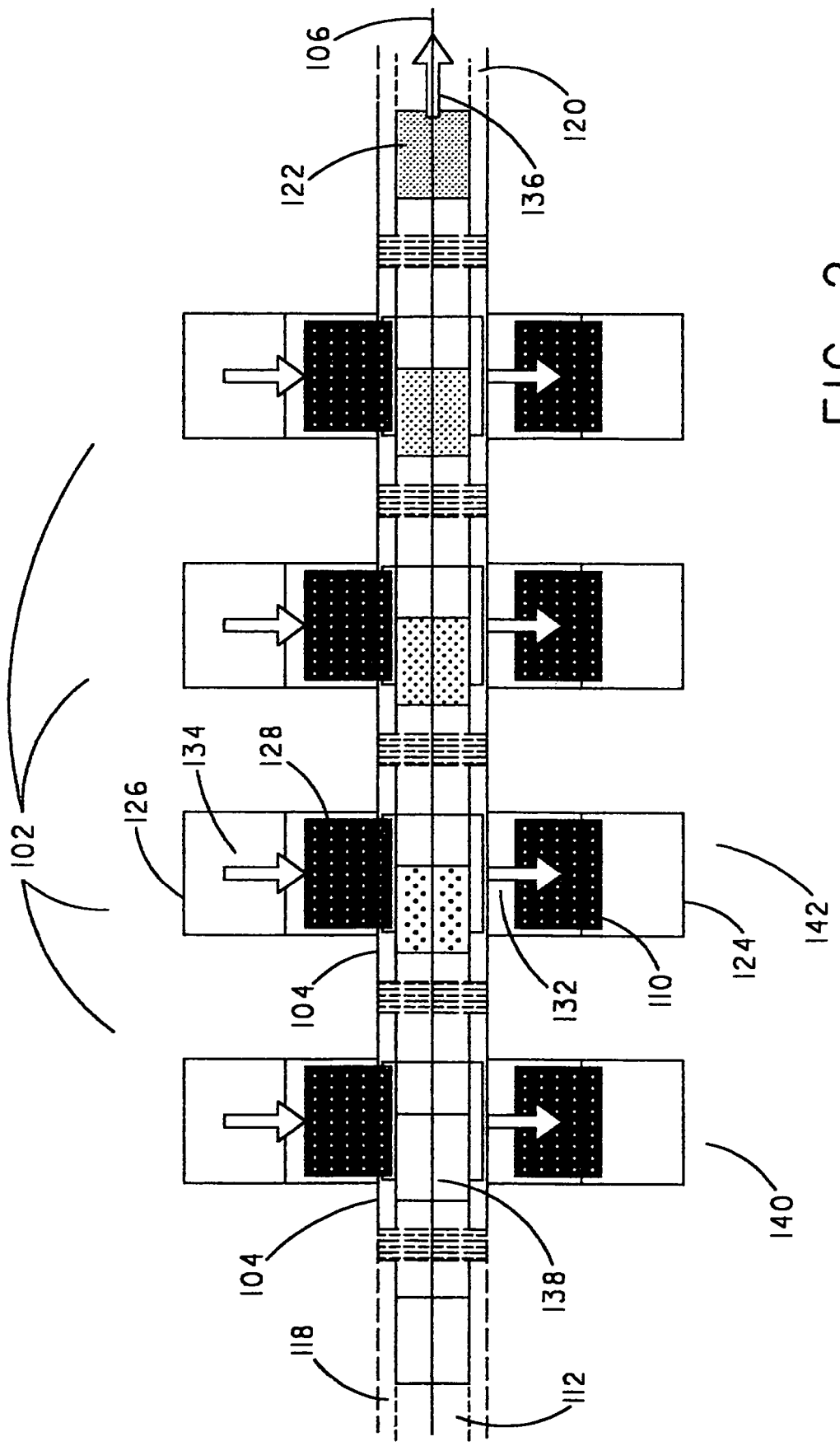
FIG. 2 illustrates the plurality of stations of FIG. 1a, wherein used shadow masks are being replaced with clean shadow masks.
Figure 3:
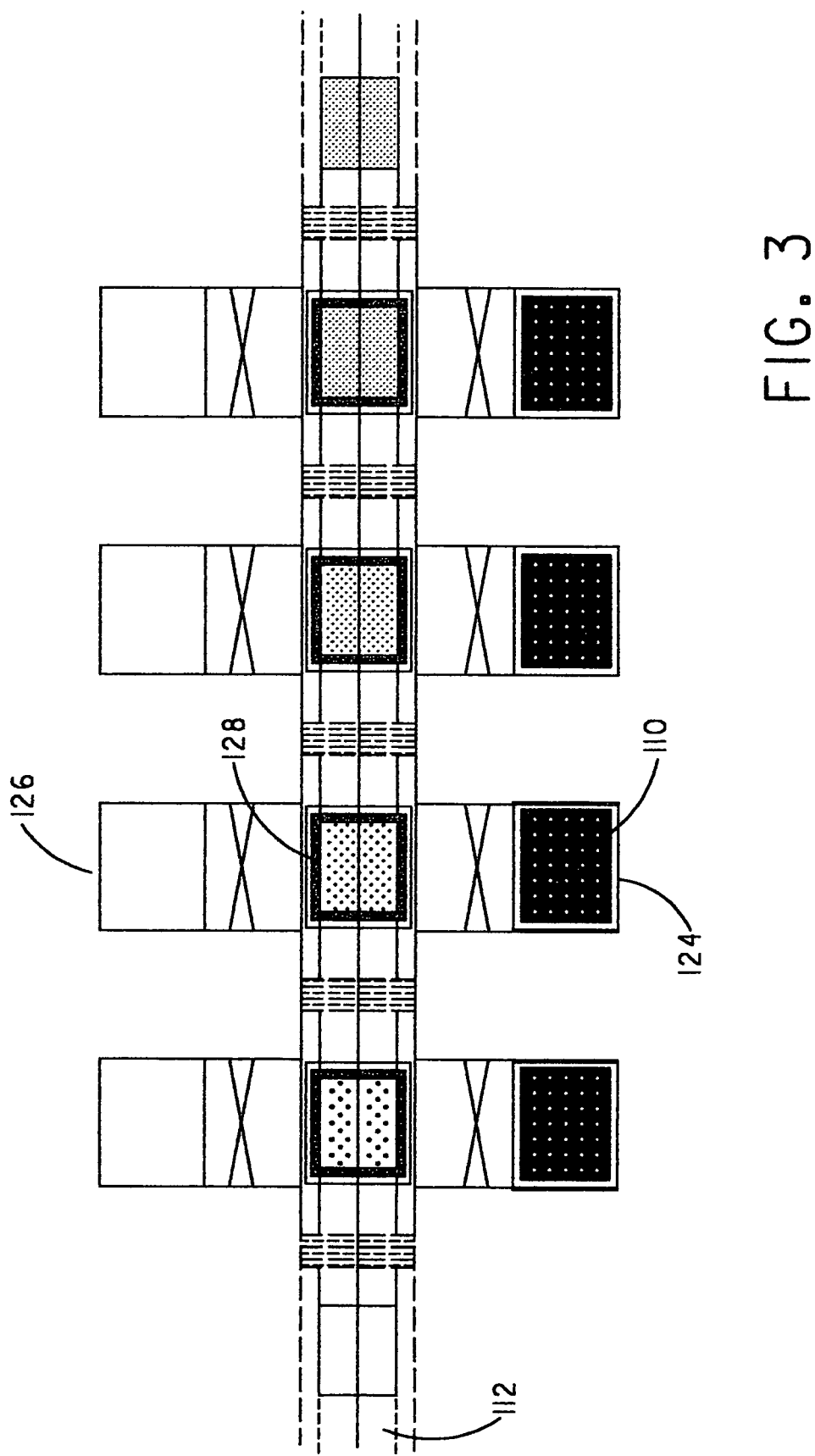
FIG. 3 illustrates the plurality of stations of FIG. 1a wherein the second shadow mask has replaced the first shadow mask in the deposition vessel, and the first shadow mask is positioned in a cleaning vessel.

Mask 128 positioned in second cleaning vessel 126 can be cleaned concurrently with a deposition being performed through first mask 110 in deposition chamber 104. FIGS. 1a, 2 and 3 illustrate a portion of a fabrication process for forming an electronic device in system 100. Following a first deposition of a deposition material in deposition vessel 104 concurrent with the cleaning of second mask 128 in the second cleaning vessel 126, illustrated in FIGS. 1a and 1b, first mask 110 is transported 132 from deposition vessel 104 to first cleaning vessel 124, and second mask 128 is transported 134 from second cleaning vessel 126 to deposition vessel 104, as illustrated in FIG. 2.

In addition, as also illustrated in FIG. 2, substrate 112 is advanced in a process direction 136 along fabrication path 106, whereupon a new section 138 of substrate 112 is introduced to system 100 at entrance 118 and a section of substrate bearing one or more completed electronic device(s) 122 exits the system 100 at exit 120. When substrate 112 is advanced in process direction 136, each portion of substrate 112 positioned for a deposition in deposition vessel 104 at a first station 140 of the plurality of stations 102 is moved and repositioned for a next deposition in the deposition vessel 104 of an adjacent, second station 142 of the plurality of stations 102. That is, substrate 112 is advanced stepwise. In one embodiment, substrate 112 is flexible and is advanced through the system 100 from a cylindrical supply reel (not shown). In another embodiment, substrate 112 comprises individual sections of substrate material that are advanced individually through system 100. Several means for advancing the substrate along the fabrication path are known in the art, including traction on the substrate, conveyor systems and robotic substrate handling systems. For example, substrate 112 can be continuous along fabrication path 106 and can be advanced along fabrication path 106 using traction rollers.

When translation of first mask 110 to first cleaning vessel 124 and second mask 128 to deposition vessel 104 is complete and substrate 112 has been advanced, as illustrated in FIG. 3, first mask 110 is cleaned in the first cleaning vessel 124 concurrently with a deposition being performed in deposition vessel 104 using second mask 128. Following this deposition in deposition vessel 104 and the cleaning of first mask 110 in first cleaning vessel 124, substrate 112 is again advanced along fabrication path 106 and the translation direction of first mask 110 and second mask 128 along cleaning path 130 is reversed with respect to the translation described in association with FIG. 2, whereupon first mask 110 is returned to deposition vessel 104 and the second mask 128 is returned to second cleaning vessel 126. By repeating the above sequence, first mask 110 and second mask 128 are thus cleaned and used for patterning onto the substrate 112 in an alternating manner. Each process station 102 can be operated independently or synchronously with regard to which of its respective masks is used for depositing on the substrate or being cleaned at a particular time. For example, whereas FIG. 1a illustrates all of process stations 102 having their second masks 128 being cleaned in second cleaning vessels 126 concurrently with depositions in deposition vessels 104, in another embodiment, each of one or more of the plurality of process stations 102 may have its first mask 110 being cleaned in its corresponding first deposition vessel 124 concurrently with a deposition occurring in its corresponding deposition vessel 104, while other process stations 102 have their second masks 128 being cleaned in their corresponding second cleaning vessels 126.

A maximum throughput rate (minimum time) for forming electronic devices using manufacturing system 100 is determined by the sum of a first, longest time required to perform a deposition in one of process stations 102, a second time required to advance a portion of the substrate 112 from one process station 102 to a next process station 102 along fabrication path 106, and a third time required to cycle the portion of the substrate 112 through any pressure, temperature and chemical environment changes required for it to be advanced. Desirably, the minimum time is not limited by a time required to clean a mask or by the time required to cycle a mask between a cleaning vessel and an associated deposition vessel. That is, a cleaning cycle is desirably faster than a deposition cycle. In one embodiment, the time from the beginning of a deposition onto a first portion of a substrate in a deposition vessel 104 to the beginning of a next deposition on a second portion of the substrate in deposition vessel 104 (a station cycle time) is less than two minutes. In another embodiment, the cycle time between deposition events in the same deposition vessel 104 is less than 30 seconds.

Figure 4:
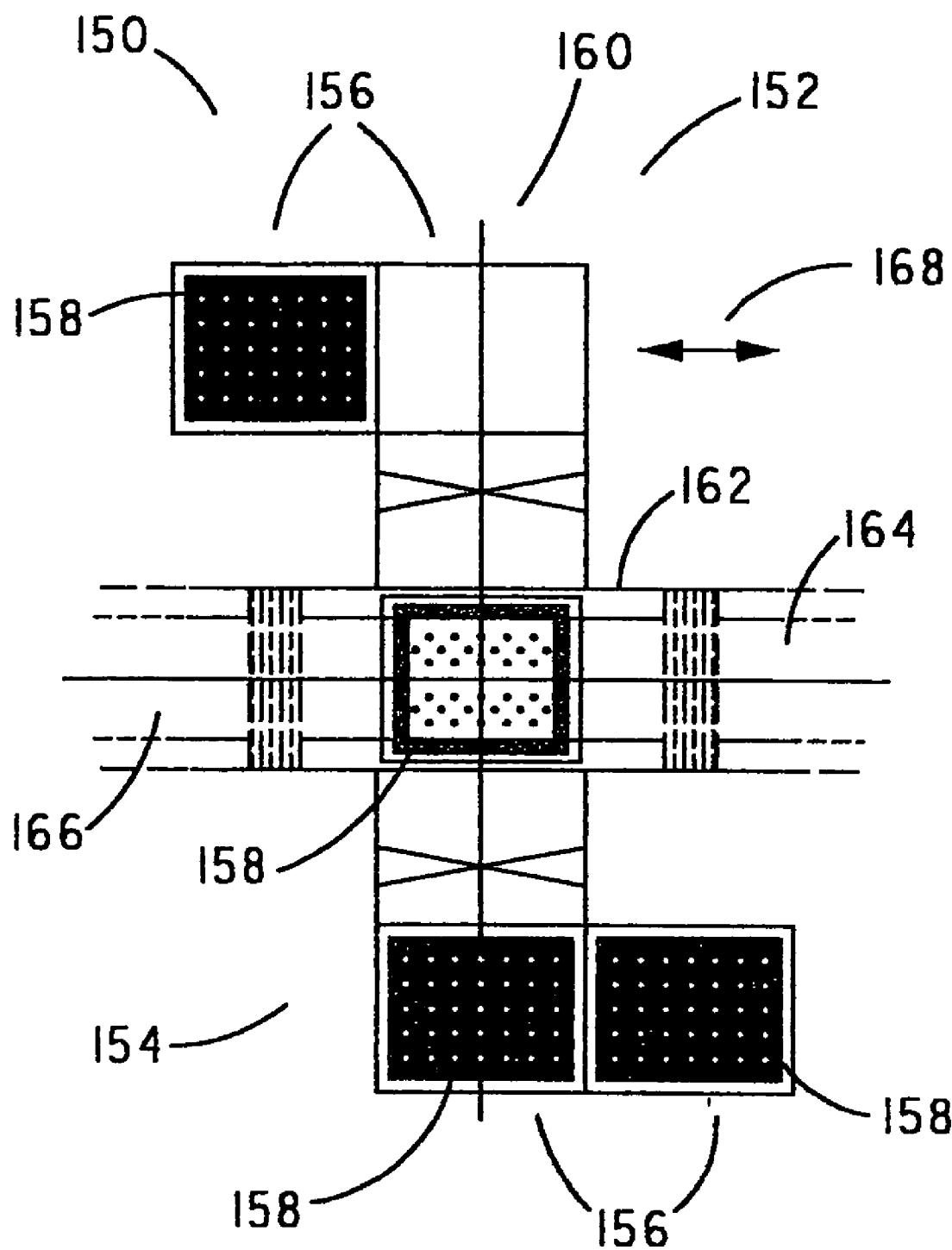
FIG. 4 illustrates schematically in plan view an embodiment of a multi-mask process station of the present invention.

In some situations, the time required to clean a mask may exceed the time required for a deposition. Long cleaning times for masks can be accommodated in a manufacturing system of the present invention by providing more than two masks at a process station along a fabrication path. FIG. 4 illustrates in plan view a multi-mask process station 150 of a manufacturing system of the present invention. One or more processed stations 150 can replace a corresponding number of process stations 102 in electronic device manufacturing system 100. Multi-mask station 150 includes a first cleaning vessel 152 and a second cleaning vessel 154, each having two cleaning chambers 156. A shadow mask 158 is associated with each cleaning chamber 156, each cleaning chamber 156 being adapted for independently cleaning a respective mask 158 and for transport of the respective mask 158 along a cleaning path 160 between the cleaning chamber 156 and a deposition vessel 162, the deposition vessel 162 being positioned along a fabrication path 164 for advancing a substrate 166. In addition to the sequence described in association with FIGS. 1-3 for transporting masks alternatingly between cleaning vessels and a deposition vessel, operation of multi-mask station 150 includes, within each of the first cleaning vessel 152 and the second cleaning vessel 154, alternately transporting a mask 158 from each of the two cleaning chambers 156 thereof to the deposition vessel 162, thereby increasing the time available to clean each mask 158, since each mask 158 is used only every fourth deposition in deposition vessel 162.

In one embodiment, alternately transporting a mask from each of the two cleaning chambers 156 comprises translating 168 the two cleaning chambers 156 as a unit so that the two cleaning chambers 156 are alternately positioned along the cleaning path 160, depending on which of the two cleaning chambers 156 contains the mask to be next used for a deposition. In FIG. 4 the first cleaning vessel 152 and the second cleaning vessel 154 are illustrated on opposite ends of cleaning path 160. In another embodiment, the two cleaning chambers 156 of each of the first cleaning vessel 152 and the second cleaning vessel 154 are fixed in position and each mask 158 is independently transported between each cleaning chamber 156 and the cleaning path 160, for transport to and from the deposition chamber 162.

Figure 5:
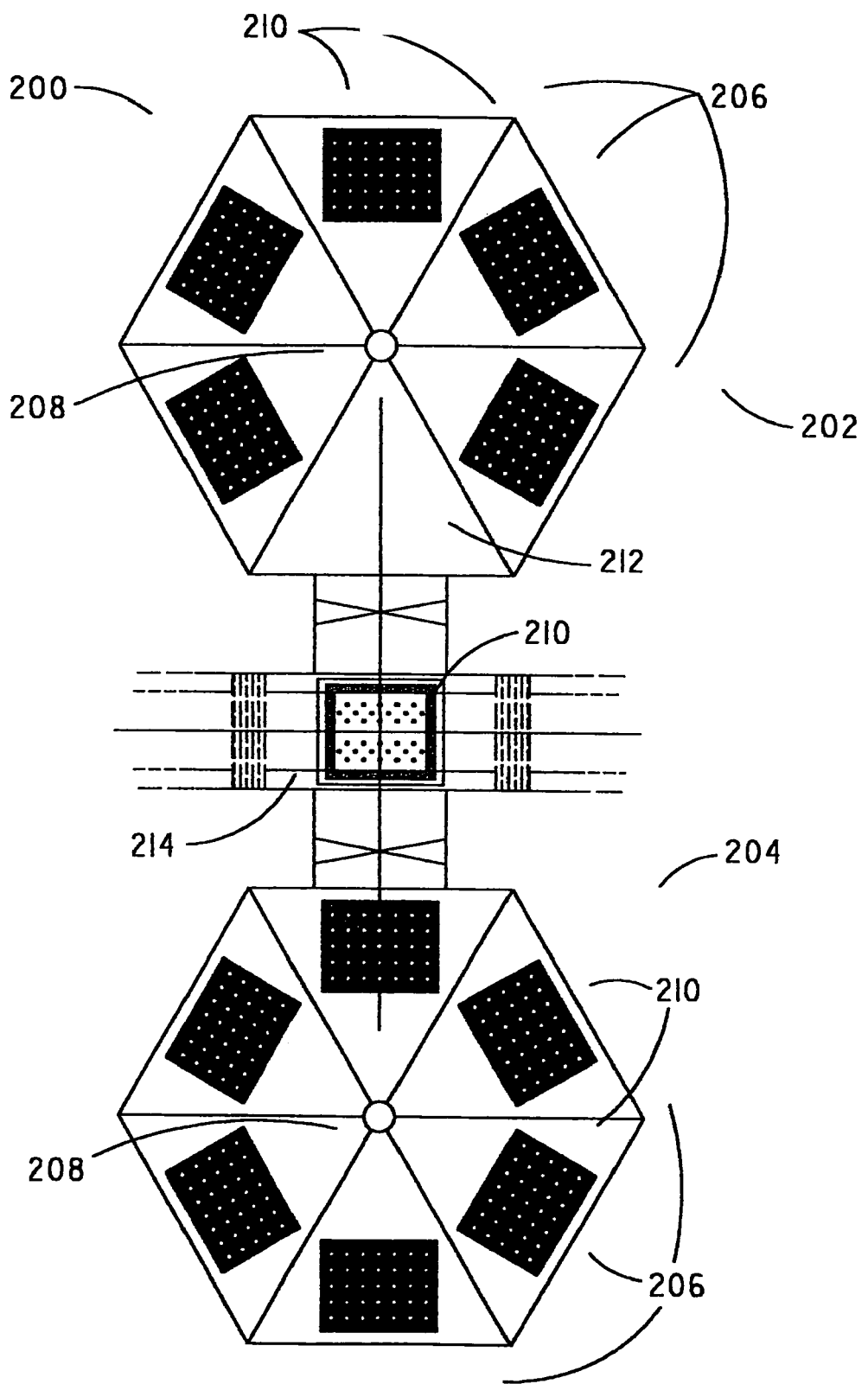
FIG. 5 illustrates schematically in plan view an embodiment of a carousel process station of the present invention.

Another type of multi-mask process station is the mask carousel process station 200 shown in FIG. 5. Mask carousel station 200 includes a first carousel cleaning vessel 202 and a second cleaning vessel 204, with each cleaning vessel including a plurality of cleaning chambers 206 arranged about an axis 208 and having one or more shadow masks 210 associated therewith. The plurality of cleaning chambers 206 of each cleaning vessel 202 and 204 is configured to rotate about axis 208 to sequentially position each mask 210 positioned in cleaning chamber 206 for transport along a cleaning path 212 that extends between first cleaning vessel 202 and second cleaning vessel 204 via deposition vessel 214. Desirably, more than one mask 210 in at least one of first and second cleaning vessels 202 and 204 is cleaned simultaneously.

Cleaning of a shadow mask using methods, apparatus or systems of the present invention may be performed using any suitable nondestructive cleaning method compatible with coupling to a means for rapidly transporting the mask between a cleaning vessel and a vacuum deposition vessel between depositions in the deposition vessel. Suitable cleaning methods include plasma-based processes such as Reactive Ion Etching (RIE), physical sputtering and ion milling, as well as photochemical etching, thermal, laser ablative, and chemical etching methods. RIE is a chemically selective etching process in which a surface to be cleaned is exposed, under moderate vacuum conditions typically in the range of 20 torr to $10^{-3}$ torr in the cleaning vessel, to a plasma including gaseous chemical species that react rapidly with the material to be removed from the mask surface, while reacting much more slowly or being unreactive with an underlying material. Reaction products are volatile in the plasma environment and pumped away. Physical sputtering is a less chemically selective plasma process, typically performed at lower pressures than RIE, with the etching performed by surface collisions of energetic but chemically inert chemical species.

Depending on the chemical composition of the mask and of the material to be removed, RIE gases typically are gaseous or volatilizable chemical compounds, or elemental oxidizing gases including fluorine, chlorine, bromine, iodine and oxygen, or reducing gases including hydrogen and hydrogen-containing compounds. Masks may be made from any material that can be fabricated as a thin sheet having a pattern of apertures suitable for patterning a deposition material onto a substrate, and mask construction materials may be selected for inertness under RIE, relative to an etching gas. Thus, it may be desirable to manufacture masks from different materials to pattern different layers in the formation of an electronic device, depending on a desired cleaning chemistry. Typically, masks are metallic, manufactured from pure metals or alloys. Common mask materials include nickel, copper, and refractory metals.

Referring again to FIGS. 1-3, the pressure and the chemical environment within each deposition vessel 104 is generally different from the pressure and the chemical environment within an associated first and/or second cleaning vessels 124, 126. In addition, each process station 102 may require a deposition material that is different from a deposition material required for deposition at an adjacent process station 102 along the fabrication path 106. To maintain these differences in environment, the fabrication system 100 includes suitable means to isolate the internal working environments of each deposition vessel 104 and its corresponding first and second cleaning vessels 124, 126.

Deposition vessel 104 of each process station 102 along fabrication path 106 is isolated from deposition vessel 104 in an adjacent process station 102 by a station separation means 250 through which substrate 112 can be translated. In one non-limiting embodiment, station separation means 250 is a vacuum valve that is closed between separate sections of substrate 112 along the fabrication path 106 during a deposition. Also or alternatively, where substrate 112 is continuous along fabrication path 106, the vacuum valve seals one or more surfaces of substrates 112. Desirably, the vacuum valve is adapted for rapid opening and closure, and adjacent deposition vessels are at substantially the same pressure as one another before the vacuum valve is opened. In one embodiment, the vacuum valve is a gate valve.

In another embodiment, depositions in adjacent deposition vessels 104 are performed at a similar pressure and separation means 250 is a substantially slot-shaped opening through which substrate 112 is translated along fabrication path 106. In a further embodiment, separation means 250 is ported to a vacuum source to support the isolation of deposition vessels 104 in adjacent process stations 102. In another embodiment, each separation means 250 is ported to a separate vacuum source so that a plurality of separation means 250 can be differentially pumped along the fabrication path 106.

Each cleaning vessel 124, 126 is isolated from its associated deposition vessel 104 by a vacuum valve 252 through which a mask can be translated. Each vacuum valve 252 can be ported to a vacuum source to enhance isolation of deposition vessel 104 from its corresponding cleaning vessels 124, 126. In another embodiment, each vacuum valve 252 is ported to a separate vacuum source so that a plurality of vacuum valves 252 can be differentially pumped along cleaning path 130. In one embodiment, vacuum valve 252 is a load lock.

FIG. 6 illustrates another embodiment of a process station 300 of the present invention. Process station 300 includes a deposition vessel 302, a first cleaning vessel 304, a second cleaning vessel 306, a first valve 308 for isolating the first cleaning vessel 304 from the deposition vessel 302 and a second valve 310 for isolating the second cleaning vessel 306 from the deposition vessel 302. Deposition vessel 302 is positioned along a fabrication path 311 (out of the plane of FIG. 6).

Deposition vessel 300 includes a first shadow mask 312 and deposition source 314 adapted for patterning a deposition material 316 through mask 312 onto a substrate 317. Deposition vessel 302 is ported to a vacuum source 318 for establishing and maintaining vacuum for performing depositions. Each cleaning vessel 304 and 306 includes a cleaning means 320. In one embodiment, cleaning means 320 is RIE. In another embodiment, cleaning means 320 is physical sputtering. Each cleaning vessel 304 and 306 is ported to a corresponding vacuum source 322. A second shadow mask 324 is shown positioned in second cleaning vessel 306 for removing deposited material 326 from second mask 324. As second mask 324 is cleaned, removed material 326 is pumped from second cleaning vessel 306 by its corresponding vacuum source 322.

Each of first valve 308 and second valve 310 is ported to a corresponding vacuum source 328 for enhancing the isolation of respective first and second cleaning vessels 304 and 306 from deposition vessel 302. Each cleaning vessel 304, 306 is adapted for at least one of rapid flushing with a purging gas, and rapid pumpdown from a pressure used for mask cleaning, to a lower pressure suitable for performance of a deposition in deposition vessel 302.

FIGS. 6-9 illustrate an exemplary cycle of exchanging masks among deposition chamber 302, first cleaning vessel 304 and second cleaning vessel 306 during time intervals between depositions in deposition vessel 302. Referring to FIG. 6, station 300 includes first mask 312 positioned in deposition vessel 302 and second mask 324 positioned in second cleaning vessel 306. In FIG. 6, a first deposition is in progress in deposition vessel 302 concurrently with cleaning second mask 324 in second cleaning vessel 306. First and second valves 308 and 310 are closed. Turning now to FIG. 7, following completion of the first deposition, first and second valves 308 and 310 are opened. First mask 312 is then transported 332 through first valve 308 from deposition vessel 302 to first cleaning vessel 304 and second mask 324 is transported 332 through second valve 310 from second cleaning vessel 306 to deposition vessel 302. Transport of first and second masks 312 and 314 may be by any suitable means compatible with transport of a thin, flat object under vacuum through a vacuum valve, including conveyor belts, rollers, robotic arms or other mechanical means.

For maximum throughput in a manufacturing system of the present invention for volume manufacturing of electronic devices, it is generally preferred that mask cleaning does not limit the production speed. To this end, the cleaning of second mask 324 is completed and both first and second cleaning vessels 304 and 306 are pumped down to substantially the pressure in deposition vessel 302 before first and second valves 308 and 310 are opened. In another embodiment, an end point detection means is included in each cleaning vessel 304 and 306. End point detection supports maximum throughput of manufacturing system 300 by signaling manufacturing system 300 to stop cleaning a mask as early as possible. End point detection also provides quality control for the cleaning process, preventing either incomplete cleaning of a mask, or erosion of a mask associated with overcleaning, for example, by unnecessarily long exposure to a plasma.

Suitable technologies for end-point detection include any technology that can sense the presence of a predetermined deposition material on a mask surface. In one embodiment, end point detection uses an optical sensor to monitor changes in the emission spectrum of plasma above the surface being cleaned, as a deposition material is removed from the surface into the plasma. In another embodiment, a cleaning end point is determined using at least one of spectroscopic absorption, fluorescence and scattering measurements of electromagnetic radiation introduced into a cleaning vessel from an external radiation source. In yet another embodiment, measurement of an electrical characteristic of the plasma is used to detect an end point of a cleaning process. In still another embodiment, an end point is determined by measuring a physical reference mark on, or aperture through a mask being cleaned. In yet another embodiment, a mask includes a chemical component added as an indicator to a material from which the mask is constructed to assist in end point detection.

Figure 8:
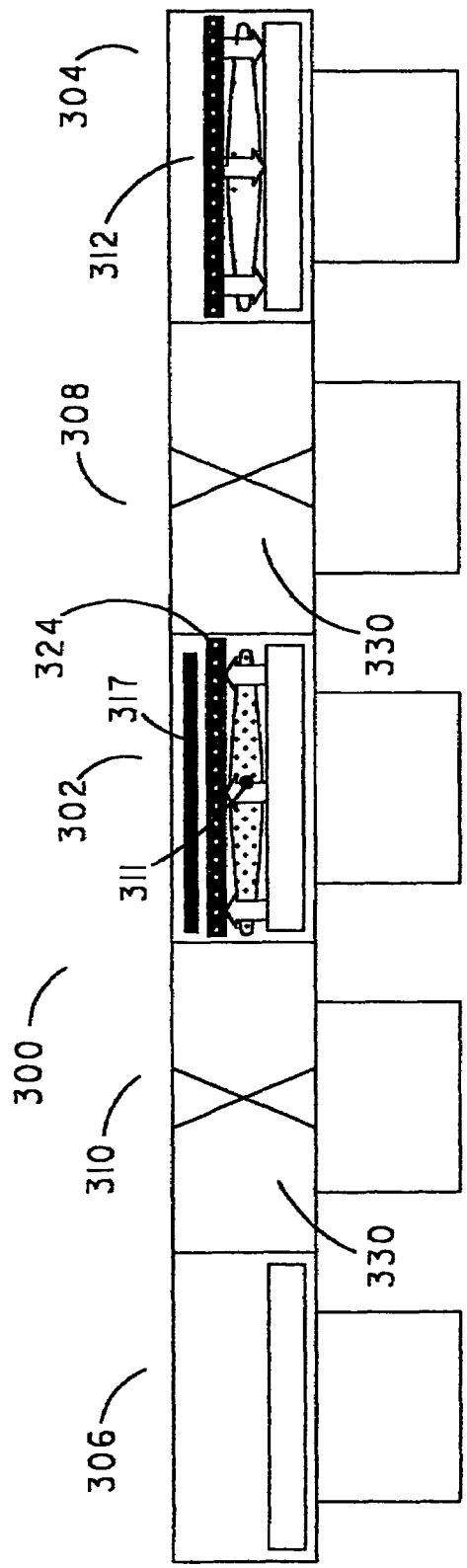
Figure 9:
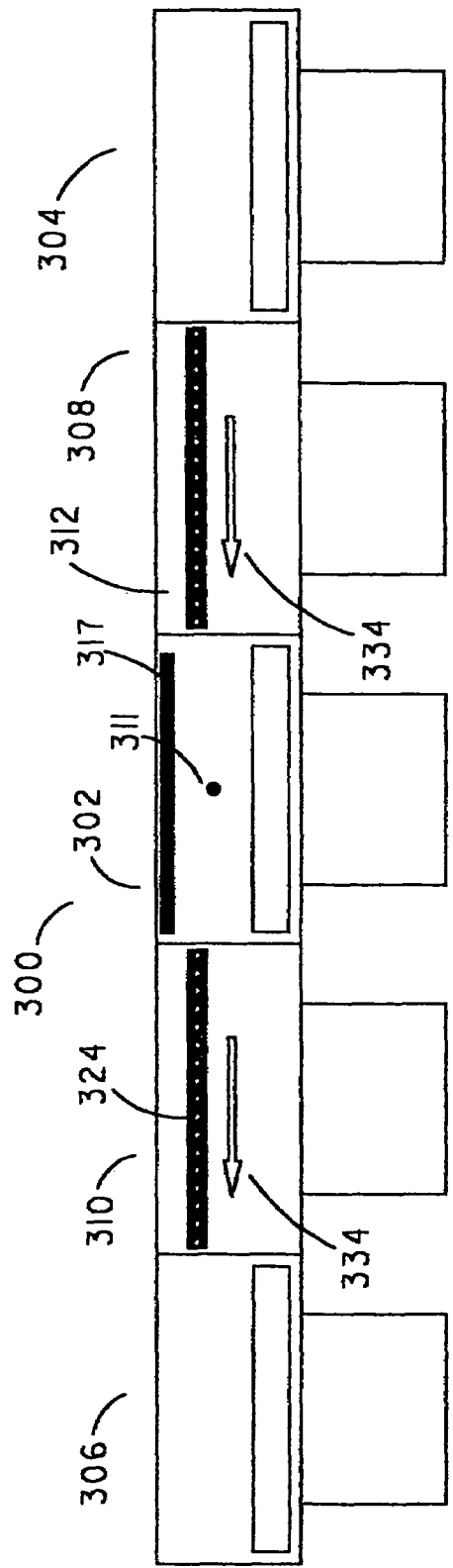

In one embodiment, substrate 317 is advanced along fabrication path 311 concurrently with transport of first and second masks 312 and 324 among first cleaning vessel 304, deposition vessel 302 and second cleaning vessel 306. In another embodiment, advancing substrate 317 and transporting first and second masks 312 and 324 are performed sequentially. Desirably, the pressure in deposition vessel 302 is maintained substantially constant during transport of first and second masks 312 and 324. Turning now to FIG. 8, first mask 312 is positioned in first cleaning vessel 304, second mask 324 is positioned in deposition vessel 302, and first and second valves 308 and 310 have been closed 330. Cleaning of first mask 312 in first cleaning vessel 304 is in progress concurrently with a second deposition occurring in deposition vessel 302. Turning finally to FIG. 9, after completion of the second deposition using second mask 324 and cleaning of first mask 312, first and second masks 312 and 324 are transported in a direction 334 opposite the transport 332 illustrated in FIG. 7, returning first mask 312 to deposition vessel 302 and second mask 324 to second cleaning vessel 306, as illustrated in FIG. 6.

Embodiments of the present invention have many advantages, including, but not limited to, advantages associated with enhanced manufacturability of electronic devices and reduced cost of fabrication facilities for electronic devices, particularly for large area electronic devices. A fabrication system of the present invention is scalable in a straightforward manner to producing electronic devices on very large substrates, limited primarily by the manufacturability of large area shadow masks. Further, by cleaning the shadow masks frequently and in proximity to a deposition vessel, manufacturing speed is optimized, the performance of the shadow masks is maintained over many deposition cycles, and the risk of damaging a mask associated with transporting the mask elsewhere for cleaning is eliminated. In addition, and particularly for multi-mask and carousel embodiments of the present invention, the inherent redundancy of using a plurality of masks at each process station enables replacement of a failed or worn mask without stopping a production line, by replacing the mask during the time it would have been cleaned.

Another advantage of electronic device manufacturing systems and methods of the present invention is its unity of manufacturing technology. Unlike photolithographic manufacturing facilities that employ many disparate manufacturing technologies and many types of manufacturing equipment to produce a single type of electronic device, a manufacturing system of the present invention employs only material deposition and related mask cleaning technologies to produce an electronic device. This unity of technology will enable manufacturing facilities to be constructed for substantially lower cost than present photolithographic manufacturing facilities. Yet another advantage of the present invention is that it provides an electronic device manufacturing system that does not have to be completely enclosed in a clean room environment, since most or all manufacturing steps for the electronic devices are performed in a series of interconnected vacuum vessels.

The invention has been described with reference to the preferred embodiment. Obvious modifications and alterations will occur to others upon reading and understanding the preceding detailed description. It is intended that the invention be construed as including all such modifications and alterations insofar as they come within the scope of the appended claims or the equivalents thereof.

The invention claimed is:

1. A method of forming an electronic device comprising:
    (a) sequentially advancing a substrate through a plurality of vacuum deposition vessels positioned along a fabrication path, wherein each deposition vessel includes (i) a material deposition source including deposition material, (ii) a first shadow mask positioned within the deposition vessel, the first shadow mask having a predetermined pattern of apertures therethrough, (iii) a first cleaning vessel positioned adjacent the deposition vessel, and (iv) a second cleaning vessel positioned adjacent the deposition vessel, wherein:
        the first cleaning vessel, the deposition vessel and the second cleaning vessel define a cleaning path that is transverse to the fabrication path;
        a second shadow mask is positioned in the second cleaning vessel, the second shadow mask having the predetermined pattern of apertures therethrough;

the first cleaning vessel is operative for cleaning the first shadow mask when the first shadow mask is received therein; and the second cleaning vessel is operative for cleaning the second shadow mask when the second shadow mask is received therein;

(b) cleaning the second shadow mask positioned in the second cleaning vessel concurrently with depositing the deposition material through the predetermined pattern of apertures of the first shadow mask and onto the substrate;

(c) moving the first shadow mask along the cleaning path from the deposition vessel to the first cleaning vessel and moving the second shadow mask along the cleaning path from the second cleaning vessel to the deposition vessel; and (d) cleaning the first shadow mask positioned in the first cleaning vessel concurrently with depositing the deposition material through the predetermined pattern of apertures of the second shadow mask and onto the substrate.

2. The method of claim 1, further including:

(e) moving the second shadow mask along the cleaning path from the deposition vessel to the second cleaning vessel and moving the first shadow mask along the cleaning path from the first cleaning vessel to the deposition vessel; and (f) repeating step (b)-(e) at least once.

3. The method of claim 2, further including advancing the substrate along the fabrication path between deposits of deposition material onto the substrate.

4. The method of claim 1, further comprising measuring an end point for cleaning each shadow mask to indicate when the shadow mask is clean.

5. The method of claim 1, wherein the deposition material is chemically distinct from a chemical component of each shadow mask.

6. The method of claim 1, wherein each cleaning vessel includes a plurality of cleaning chambers, each chamber operative for cleaning a shadow mask.

7. The method of claim 1, wherein each cleaning vessel includes a plasma source or a source of gaseous etchant for cleaning the corresponding shadow mask.

8. The method of claim 7, wherein the etchant is selected from either:

a group consisting of a halogen, a halogen-containing chemical compound and oxygen; or a group consisting of hydrogen and a hydrogen-containing chemical compound.

9. The method of claim 1, wherein:

the first cleaning vessel and the deposition vessel are interconnected by a first vacuum valve;

the second cleaning vessel and the deposition vessel are interconnected by a second vacuum valve;

moving the first shadow mask includes passing the first shadow mask through the first valve; and moving the second shadow mask includes passing the second shadow mask through the second valve.

10. The method of claim 1, wherein the cleaning path is substantially linear.

11. The method of claim 1, wherein a time required for cleaning at least one shadow mask is either:

less than a time required for depositing the material on the substrate; or does not substantially exceed a time required for depositing the material on the substrate.

12. A method of forming an electronic device comprising:

(a) providing a substrate adapted for advancement along a fabrication path, a first portion of the substrate positioned at a first process location along the path;

(b) providing a deposition source for depositing a material on the substrate at the first process location;

(c) providing a first shadow mask and a second shadow mask substantially identical to the first shadow mask;

(d) positioning the first shadow mask between the deposition source and the first portion of the substrate and positioning the second shadow mask adjacent the fabrication path;

(e) depositing the material on the first portion of the substrate through the first shadow mask while concurrently cleaning the second shadow mask;

(f) advancing the substrate along the fabrication path whereupon a second portion of the substrate is positioned at the first process location;

(g) positioning the second shadow mask between the deposition source and the second portion of the substrate and positioning the first shadow mask adjacent to the fabrication path; and (h) depositing the material on the second portion of the substrate through the second shadow mask while concurrently cleaning the first shadow mask.

13. The method of claim 12, wherein the material is deposited and each shadow mask is cleaned in the presence of a vacuum.

14. The method of claim 12, further comprising providing a first cleaning vessel for cleaning the first shadow mask and a second cleaning vessel for cleaning the second shadow mask, wherein each cleaning vessel includes means for determining completion of a cleaning process.

15. The method of claim 12, wherein cleaning each shadow mask comprises (i) exposing the shadow mask to at least one of a plasma and a chemical etchant, (ii) reactive ion etching or (iii) physical sputtering.

16. The method of claim 12, wherein a time required for cleaning either shadow mask is either:

less than a time required for depositing the material on the substrate; or does not substantially exceed a time required for depositing the material on the substrate.

* * * * *